(12) United States Patent
Kautz et al.

(10) Patent No.: US 6,953,910 B2
(45) Date of Patent: Oct. 11, 2005

(54) ASSEMBLY ELEMENT FOR TOW COMPONENT PARTS OF A DEVICE

(75) Inventors: Stefan Kautz, Langensendelbach (DE); Heinrich Zeininger, Obermichelbach (DE)

(73) Assignee: Siemens Aktiengesellschaft, Munich (DE)

( * ) Notice: Subject to any disclaimer, the term of this patent is extended or adjusted under 35 U.S.C. 154(b) by 107 days.

(21) Appl. No.: 10/450,948
(22) PCT Filed: Dec. 10, 2001
(86) PCT No.: PCT/DE01/04640
§ 371 (c)(1), (2), (4) Date: Jun. 18, 2003
(87) PCT Pub. No.: WO02/51225
PCT Pub. Date: Jun. 27, 2002

(65) Prior Publication Data
US 2004/0035836 A1 Feb. 26, 2004

(30) Foreign Application Priority Data
Dec. 18, 2000 (DE) .......................................... 100 63 085

(51) Int. Cl.[7] ................................................. H05B 1/00
(52) U.S. Cl. ....................................................... 219/201
(58) Field of Search ................................. 219/201, 752; 361/752

(56) References Cited

U.S. PATENT DOCUMENTS

| | | | |
|---|---|---|---|
| 5,098,305 A | * 3/1992 | Krajewski et al. | ............. 439/75 |
| 5,176,884 A | 1/1993 | Taschner et al. | |
| 5,199,139 A | * 4/1993 | Hutchinson | .................. 24/108 |
| 5,553,766 A | 9/1996 | Jackson et al. | |
| 5,769,159 A | * 6/1998 | Yun | ........................... 165/276 |
| 6,404,636 B1 | * 6/2002 | Staggers et al. | ............. 361/704 |
| 6,640,432 B1 | * 11/2003 | Mathieu et al. | ................ 29/842 |

FOREIGN PATENT DOCUMENTS

| | | | |
|---|---|---|---|
| GB | 2 217 451 | 10/1989 | |
| JP | 2001015956 A | * 1/2001 | ............. H05K/7/12 |

OTHER PUBLICATIONS

Materials Science & Engineerin, Strnadel et al., "Cyclic strees–strain characteristics of Ti–Ni and Ti–Ni–Cu shape memory alloys", 1995, pp. 148–156.
Intermetallics 3, Goldberg et al., "Characteristics of $Ti_{50}Pd_{30}Ni_{20}$ high–temperature shape memory alloy", 1994, pp. 35–46.
Pergamon Press Ltd., Lo et al., "Compositional Dependence of Martensitic Transformation Sequence In..", vol. 27, pp. 1097–1102.
Sade et al, "Thermo–Mechanical and Pseudoelastic Fatigue of a Polycrystalline Cu Zn 24 Al 3 Alloy", gps. 678–683.
Scripta Materialia, Recarte et al., "Precipitation of the Stable Phases in Cu–Al–Ni Shape Memory Alloys", pp. 255–260.
Transactions of the ASME, Humbeeck, "High Temperature Shape Memory Alloys", vol. 121, 1999, pp. 98–101.

* cited by examiner

*Primary Examiner*—Robin O. Evans
*Assistant Examiner*—Vinod Patel
(74) *Attorney, Agent, or Firm*—Young & Thompson

(57) ABSTRACT

The assembly element is mechanically connected to two component parts of a device (2) at least once the device is assembled. A shape-memory metal element (6i, 7i), is provided as the assembly element, the metal element having a first form during assembly of the device (2) and a second form, which assures the mechanical connection between the two component parts (3a–3d, 4a–4c) of the device, when the device is assembled. The second form is memorized by the shape-memory metal element before assembly, by its shape-memory properties.

3 Claims, 1 Drawing Sheet

ASSEMBLY ELEMENT FOR TOW COMPONENT PARTS OF A DEVICE

CROSS REFERENCE TO RELATED APPLICATIONS

This is the 35 USC 371 national stage of international application PCT/DE01/046140 filed on Dec. 10, 2001, which designated the United States of America.

FIELD OF THE INVENTION

The invention relates to an assembly means for two individual parts of a device, the assembly means, at least in the assembled state of the device, being connected in a positively locking manner to the two individual parts of the device.

BACKGROUND OF THE INVENTION

Examples of known assembly means which can be used to produce in particular a positively locking and if appropriate a nonpositively locking connection between individual parts of a device are screws, rivets or clamps.

The increasing integration density involved in the development of components and mounting technologies in particular in the field of semiconductor electronics is leading to evermore powerful, smaller and more lightweight modules or corresponding devices. In addition to the high quality demands imposed on the construction of devices of this type, it is also desirable for the device production and assembly to be automated as far as possible for cost reasons. In this context, a product design with increasing miniaturization encounters the problem that the space available for the assembly and connection means for the individual parts of these devices is becoming ever smaller and/or the connection points are becoming ever more difficult to gain access to.

Moreover, statutory regulations mean that the manufacturers of certain devices are often forced to take back old devices and to provide equipment for treating or processing these old devices. Therefore, for cost reasons the devices have to be easy to dismantle.

Since the manufacturers of many devices were not previously obliged to take back old devices, requirements relating to the dismantling of the individual parts of these devices were only a minor factor in product development. In particular the technologies for circuit carriers/circuit mounting are in a state of flux; product developments are increasingly based on the innovative large scale integrated technologies, such as flip chip, ball grid array, all layers interconnected via holes technologies, etc. With new technologies of this type, it is desired to achieve high integration densities. The result of this is that the volume available for the assembly, connecting and joining technology is correspondingly reduced. With conventional connecting technologies, such as screw connections, riveted connections or clamped connections, it is becoming increasingly difficult to construct and assemble or dismantle miniaturized devices of this type.

SUMMARY OF THE INVENTION

Therefore, it is an object of the present invention to provide an assembly means for the assembly technology in particular of miniaturized devices of this type which makes it easier to put together and/or dismantle at least two individual parts of a device even at inaccessible and/or miniaturized connecting points. In the assembled state of the device, the assembly means is to ensure a mechanical connection between the individual parts which are at least to be connected.

According to the invention, this object is achieved through the fact that the assembly means includes at least one memory metal element or is formed by this element which, in the assembly state or in the assembly phase (=phase during which the device is being put together) of the device, takes a first form and which, in the assembled state of the device, takes a second form, which is responsible for ensuring the mechanical connection between the individual parts of the device and which has been imparted to the memory metal element, making use of its memory property, prior to assembly of the device. In this context, a mechanical connection is understood as meaning any desired positive lock between each of the individual parts of the device which are to be connected produced by means of the at least one memory metal element.

The advantages which are associated with this configuration of the invention are to be considered in particular to lie in the fact that the demands imposed on various phases of the life of the device can be fulfilled by using tailored application-specific materials properties, it being possible to integrate functions such as optimization of the spacing or damping of vibrations in the element by using at least one element with memory properties. Instead of having to use complex spacers and/or relatively inaccessible screw/rivet/clamping or snap-action connections, all of which require additional process steps in assembly technology, the inventive use of memory metal elements after assembly ensures the desired positive lock, and if appropriate also a nonpositive lock, in a simple manner by setting the second form on the basis of the memory effect. This setting of the second form takes place in a manner which is known per se, i.e. generally by means of a targeted heat treatment.

Advantageous configurations of the assembly means according to the invention will emerge from the dependent claims.

For example, in the assembly state of the device, it is particularly advantageously possible for the mechanical connection produced by means of the at least one memory metal element at the same time to be an electrical connection and/or a thermally conductive connection. This is because measures for making contact and in particular for dissipation of heat to in relative terms larger heat exchange surfaces are very important in particular in highly miniaturized devices. The assembly means according to the invention is able to satisfy corresponding demands in a simple way.

Furthermore, it is to be considered advantageous if the at least one element having the memory property is in the form of a spring, a strip, a bolt or a rivet. Components having application-specific forms of this type may advantageously be positioned between the individual parts which are to be connected even within a small space.

In this case, the memory metal element may advantageously be rigidly connected to one of the individual parts of the device which are to be connected, for example may be soldered to this individual part. Soldered connections of this type can advantageously be performed at the same time as soldering of further components of device or of an individual part of the device. This is highly advantageous in particular in the case of highly miniaturized devices.

Furthermore, it is to be considered advantageous if, to dismantle the device, at least one nonpositive lock between the memory metal element and at least one of the individual parts of the device can be eliminated by spatially detaching one of the individual parts from the element. Since the positive and/or nonpositive lock between the element and the individual part to be connected is generally performed only by the element being placed onto this individual part with the exertion of a compressive force, which may only be slight, simple dismantling is possible without this individual part having to be damaged or destroyed. In this way, it is even possible to reuse valuable individual parts and/or the elements with a memory property for the same or similar applications. Also, this allows dismantling or self-destruction to take place without any mechanical intervention with regard to connection between the element with a memory property and the individual part which can be detached.

The at least one memory metal element can preferably be provided as a spacer feature between two individual parts of a device. During device assembly, for example within a housing, the individual parts of the device then merely have to be loosely joined together or placed on top of one another; final positioning within the device then takes place by activation of the second form of the memory metal element in question.

However, it is also possible for the at least one memory metal element to be designed as a clamping feature, which can be used to create a clamping connection between the individual parts of the device which are to be connected.

To activate the second form of the at least one memory metal element, the latter may be assigned a heating means. This may advantageously be a heating current passing through the memory metal element in question or a heating device outside the memory metal element. In this case, it is not necessary for a plurality of memory metal elements to be activated simultaneously.

The at least one memory metal element may advantageously at least partially comprise a TiNi or NiMn or CuAl alloy, with at least one further alloying partner being present if appropriate. The excellent resistance to corrosion of the abovementioned materials represents a particular property which allows the element according to the invention to be used in a mobile vehicle, such as for example an automobile, or allows some other decentralized, mobile use, including in an environmentally polluted atmosphere. This therefore opens up the possibility of production taking place in an atmosphere of this type.

Further advantageous configurations of the connecting means according to the invention are given in the remaining claims.

BRIEF DESCRIPTION OF THE DRAWINGS

To further explain the invention, reference is made below to the drawing, which diagrammatically depicts an advantageous embodiment of a device with assembly means according to the invention and in which, in each case in a perspective view.

DETAILED DESCRIPTION OF THE INVENTION

Throughout the figures, corresponding parts are provided with identical reference symbols.

Memory metal elements according to the invention make it possible to produce a positively and if appropriate also nonpositively locking, generally at least partially releasable connection to or between individual parts of a device, preferably an electronics device. The device may in particular be a means with a high degree of integration of its components, such as for example a mobile telephone, a notebook or control electronics for automation engineering or automotive engineering. Devices of this type generally include a plurality of individual parts, such as printed circuit board assemblies or circuit carriers, shielding plates or sheets, between which, during assembly (=when the individual parts are being joined together), a mechanical connection is to be created. Special demands, such as for example the precise spacing and/or dissipation of heat both between the individual parts of the device and also of these individual parts with respect to further individual parts of the device, such as for example metal frames or shielding plates or sheets, are often also imposed on connections of this type. A corresponding electronic device is used as the basis for the exemplary embodiment shown in the figures.

Figure 1:
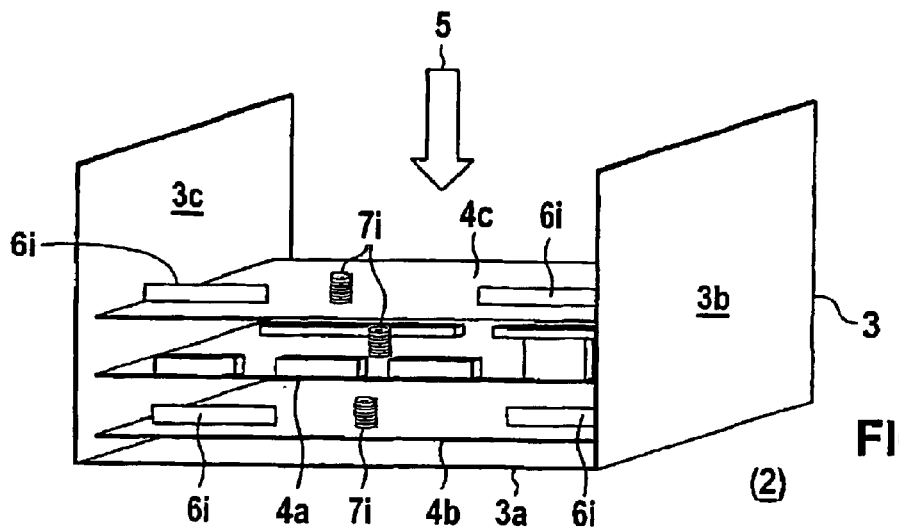
FIGS. 1 and 2 show two different assembly states of a corresponding electronic device.

FIG. 1 shows the assembly state (=construction operation or phase) of a device of this type, which is denoted overall by 2. This device has a base part 3a of a housing 3 and two laterally arranged side parts 3b and 3c. These housing parts, which consist, for example, of Al or steel sheet or plastic material, such as ABS, form a basic housing unit, which is to be mounted with flat individual parts from its side which is open at the top. These individual parts may preferably be circuit carriers or printed circuit board assemblies on which various electronic components have been mounted. The basis used for the exemplary embodiment is a module board 4a. These individual parts may equally well be shielding plates or sheets, of which in the exemplary embodiment two shielding panels 4b and 4c are assumed to lie on the two (flat) sides of the board 4a. The large-area extent of these individual parts 4a to 4c is matched to that of the housing base part 3a. Within the housing unit comprising parts 3a to 3c, they are stacked in a defined order without being locked or secured in the selected assembly or mounting direction, which is indicated by an arrow 5. Strip-like memory metal elements 6i and spring-like memory metal elements 7i are arranged on at least some of the panels, in the exemplary embodiment on the shielding panels 4b and 4c, for example are soldered to the top side of the lower shielding panel 4b and to the underside and top side of the upper shielding panel 4c. The memory metal elements 6i and 7i are in this case in a predetermined first form or configuration which does not interfere with assembly. Only after assembly are the memory metal elements to be used not only to space the panels 4a to 4c apart from one another by a desired distance. Rather, they are also to be responsible for fixing the stack formed from these panels within the housing 3 which has been closed after assembly, i.e. at least in this state there should be a positive and preferably also nonpositive lock between the plate stack 4a to 4c and the housing 3.

Figure 2:
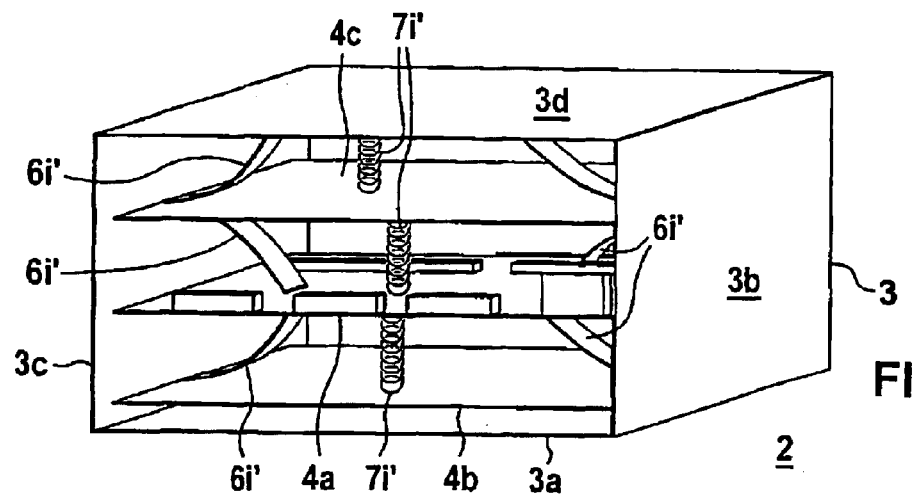
Figure 3:
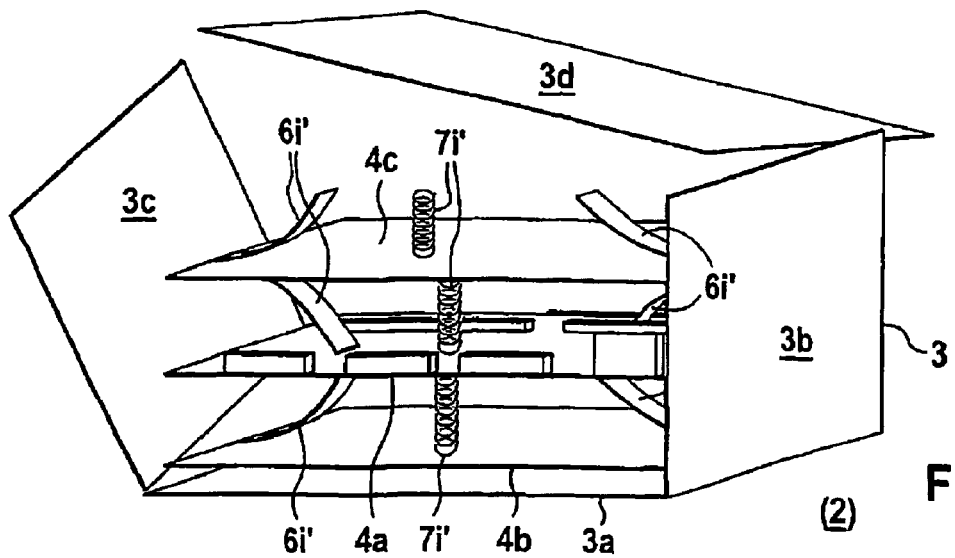
FIG. 3 shows a possible way of dismantling this device.

After the housing 3 has been closed using a housing cover part 3d, in accordance with FIG. 2 the memory metal elements 6i and 7i are activated by a heat treatment with the aid of an associated heating means. A heat treatment of this type is generally effected by an external increase in the temperature or by passing current through the element. The current may also be passed through the individual panels in succession. On account of this activation, the memory metal elements then adopt their second form or configuration, which was imparted to them in a manner known per se before they were fitted to the corresponding panel 4b or 4c. In FIG. 2, the memory metal elements 6i and 7i, after they have been activated, are denoted by 6i' and 7i', respectively. As can be seen from the figure, this second form of the memory metal elements 6i' and 7i' ensures a positive and nonpositive lock between respectively adjacent panels 4a to 4c and also between the panels and the base part 3a and the cover part 3d of the housing 3, i.e. the activation of the elements leads to self-aligning of the module board 4a and of the shielding plates or panels 4b and 4c within the housing 3 without any external mechanical intervention, in particular at inaccessible locations, being required.

To dismantle the housing 3 in which the module 4a and the shielding panels 4b and 4c have been mounted, the housing is opened, for example by the cover part 3d being lifted off, and the side parts 3b and 3c are removed sideways. In the process, the positive and nonpositive lock produced by means of the memory metal elements 6i' and 7i' with respect to these housing parts is eliminated; and the individual panels 4a to 4c can now be removed for further use.

What this means is that a degree of dismantling which, for example, complies with statutory regulations and is suitable for replacement or retrofitting of functional components without additional outlay can be achieved after the housing parts have been opened, without any destruction occurring.

The memory metal elements 6i and 7i at least partially comprise one of the known shape memory alloys. Examples of such alloys are Ti—Ni alloys, in which the Ti component and also the Ni component form the main components and further alloying partners may also be present. In addition, there are also known Cu—Al alloys with further alloying partners in which the level of the Al component may be higher or lower than that of the further alloying partner. For example, "Materials Science and Engineering", Vol. A 202, 1995, pages 148 to 156 discloses Ti—Ni and Ti—Ni—Cu alloys of various compositions.

"Intermetallics", Vol. 3, 1995, pages 35 to 46 and "Scripta METALLURGICA et MATERIALIA", Vol. 27, 1992, pages 1097 to 1102 describe special $Ti_{50}Ni_{50-x}Pd_x$ shape memory alloys. Of course, other shape memory alloys are also suitable as an alternative to the Ti—Ni alloys. For example, Cu—Al shape memory alloys are also suitable. A corresponding CuZn24A13 alloy is disclosed by "Z. Metallkde.", Vol. 79, Issue 10, 1988, pages 678 to 683. "Scripta Materialia", Vol. 34, No. 2, 1996, pages 255 to 260 describes a further Cu—Al—Ni shape memory alloy. Further alloying partners, such as for example Hf, Pd, Au, Pt, Cr or if appropriate Ti may also be added to the abovementioned binary or ternary alloys in a manner which is known per se. By way of example, this at least one further component forms less than 5 atomic %. However, the level of this at least one further component may also differ from this value to a relatively great extent. Further possible alloying partners for various binary memory metals, including for Ni—Mn alloys, are described in "Transactions of the ASME", Vol. 121, Jan. 1999, pages 98 to 101.

An Ni—Ti—Nb shape memory alloy can be selected for the exemplary embodiment described above. Corresponding alloys are commercially available and, for example on the basis of their production process, have the following properties:

austenite temperature: >+50° C.;
martensite temperature: <−50° C.

Depending on the production process, it is possible to achieve hysteresis ranges between −150° C. and +100° C. At a predetermined high temperature of several hundred ° C., a desired high-temperature shape, which can be regarded as the second form of the element, is imparted to a corresponding memory metal element. When it cools to room temperature, this second form is converted into a starting shape (=first form; cf. FIG. 1). This starting shape of the memory metal element is the basic shape during assembly of the device.

If the element or a shielding plate or other component connected to it is then heated to a temperature which is above the Austenit temperature of the memory metal, for example to 60 to 80° C., the element adopts the high-temperature shape (=second form; cf. FIG. 2) which was imparted to it. This second form is retained even after cooling back to room temperature and can only be reversed at lower temperatures (below the Martensit temperature) on account of the hysteresis property of the special metal.

Memory metals which use what is known as the one-way effect and what is known as the two-way effect can be used for the elements (6i, 7i) according to the invention. An element with a one-way effect in its memory metal can remember its high-temperature shape which was imparted to it at a very high temperature of, for example, about 800° C. when the Austenit transition temperature, which is, for example, 60° to 80° C., is exceeded. This high-temperature shape is then retained even in the event of cooling to any desired lower temperature, e.g. to room temperature or below. However, a one-way effect element of this type can be deformed by another actuator, such as for example a standard spring, in a low-temperature state, in particular below the Martensit transformation temperature. However, when it is heated it returns to the high-temperature shape which was imparted to it. On heating, an element with a two-way effect in its memory metal is also converted into the high-temperature shape which was imparted to it at a very high temperature. By training, e.g. by being deformed 20 to 200 times in the, in relative terms, colder (e.g. unheated or recooled) state, the memory metal adopts the shape into which it was trained when it is then cooled down to what is known as the Martensit phase. The result of this is that a two-way effect element of this type is deformed differently as a function of the temperature, namely into a high-temperature shape (e.g. when heated to over 80° C.) or into a low-temperature shape (e.g. when cooled to below −20° C.), i.e. depending on the temperature the two-way effect element automatically changes to the high-temperature shape which was imparted to it or to the trained low-temperature shape.

Both types of metal can be used for the elements according to the invention, in particular if the housing is opened up for dismantling, so that the individual modules, boards and plates are then exposed. Materials with a one-way effect then have a cost advantage. By contrast, elements made from a material of the two-way type return to their starting shape (=first form) when they are cooled strongly, so that they eliminate a nonpositive lock produced in their assembled state even without a housing having to be broken up.

What is claimed is:

1. An assembly of parts of an electronics device, comprising
a first part of an electronics device;
a second part of the electronics device; and
a first memory metal element between said first and second parts;
said first memory metal element having a first shape that permits placement of said first and second parts in the electronics device during assembly of the electronics device, and a second shape that is different from said first shape and that holds said first and second parts in a locked position relative to each other in an assembled state of the electronics device,
said second shape being memorized in said first memory metal element and existing after elevation of said first memory metal element above its austenite temperature, said first memory metal element retaining said second shape and holding said first and second parts in the locked position after cooling said first memory metal element below the austenite temperature and at an operating temperature of the electronics device.

2. The assembly of claim 1, further comprising a third part of the electronics device and a second memory metal element between said second and third parts, said second memory metal element having a first shape that permits placement of said third part in the electronics device during assembly of the electronics device, and a second shape that is different from said first shape and that holds said second and third parts in a locked position relative to each other in an assembled state of the electronics device, said second shape being memorized in said second memory metal element and existing after elevation of said second memory metal element above its austenite temperature, said second memory metal element retaining said second shape and holding said second and third parts in the locked position after cooling said second memory metal element below the austenite temperature and at an operating temperature of the electronics device.

3. An assembly of parts of an electronics device, comprising:

a first part of an electronics device;

a second part of the electronics device; and a first memory metal element between said first and second parts;

said first memory metal element having a first shape that permits placement of said first and second parts during assembly of the electronics device, and a second shape that is different from said first shape and that holds said first and second parts in a locked position relative to each other in an assembled state of the electronics device, said first memory metal element being a metal that changes from said first shape to said second shape upon elevation of said first memory metal element to its austenite temperature and that thereafter retains said second shape to hold said first and second parts in the locked position at temperatures lower than the austenite temperature.

* * * * *